(12) United States Patent
Basker et al.

(10) Patent No.: US 9,947,663 B2
(45) Date of Patent: Apr. 17, 2018

(54) FINFET CMOS WITH SILICON FIN N-CHANNEL FET AND SILICON GERMANIUM FIN P-CHANNEL FET

(71) Applicant: International Business Machines Corporation, Armonk, NY (US)

(72) Inventors: Veeraraghavan S Basker, Schenectady, NY (US); Kangguo Cheng, Schenectady, NY (US); Theodorus E Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 15/261,931

(22) Filed: Sep. 10, 2016

(65) Prior Publication Data

US 2018/0076202 A1 Mar. 15, 2018

(51) Int. Cl.
*H01L 21/225* (2006.01)
*H01L 27/092* (2006.01)
*H01L 29/10* (2006.01)
*H01L 21/8238* (2006.01)
*H01L 29/161* (2006.01)
(Continued)

(52) U.S. Cl.
CPC ...... *H01L 27/0924* (2013.01); *H01L 21/2255* (2013.01); *H01L 21/3081* (2013.01); *H01L 21/823821* (2013.01); *H01L 21/823878* (2013.01); *H01L 29/0649* (2013.01); *H01L 29/1083* (2013.01); *H01L 29/161* (2013.01)

(58) Field of Classification Search
CPC ......... H01L 21/823878; H01L 27/0924; H01L 29/0649; H01L 21/3081; H01L 29/161; H01L 29/1083; H01L 29/0673; H01L 29/1054; H01L 21/2255
See application file for complete search history.

(56) References Cited

U.S. PATENT DOCUMENTS 7,955,928 B2    6/2011   Chan et al.
8,901,664 B2   12/2014   Basker et al.
(Continued)

OTHER PUBLICATIONS

M. Tanaka et al., "Comprehensive study of low temperature (< 1000° C.) oxidation process in SiGe/SOI structures," Thin Solid Films, vol. 517, No. 1, 2008, pp. 251-253.
(Continued)

*Primary Examiner* — Daniel Luke
*Assistant Examiner* — Khatib Rahman
(74) *Attorney, Agent, or Firm* — Jeffrey S. LaBaw; Steven J. Meyers

(57) ABSTRACT

A substrate having a silicon region and a silicon germanium region is provided. A first set of fins in the silicon region and a second set of fins in the silicon germanium region is etched into the substrate. A set of protective caps on upper portions of the first and second sets of fins. A lower portion of each of the first and second sets of fins is oxidized. The silicon germanium portion of the lower portion of fin in the second set of fins is completely oxidized. The lower portion of the first set of fins is partially oxidized. A punchthrough stop isolation region is formed in the lower portion of the first set of fins. Another aspect of the invention is a device which is created by the method.

16 Claims, 10 Drawing Sheets

(51) Int. Cl.
*H01L 21/308* (2006.01)
*H01L 29/06* (2006.01)

(56) References Cited

U.S. PATENT DOCUMENTS

| | | | |
|---|---|---|---|
| 9,023,715 B2 | 5/2015 | Faul et al. | |
| 9,093,533 B2* | 7/2015 | Cheng | H01L 29/785 |
| 9,224,736 B1* | 12/2015 | Ching | H01L 27/0924 |
| 9,548,303 B2* | 1/2017 | Lee | H01L 27/0922 |
| 2014/0117462 A1 | 5/2014 | Cheng et al. | |
| 2014/0353760 A1 | 12/2014 | Loubet et al. | |
| 2015/0044829 A1* | 2/2015 | Kim | H01L 21/823807 |
| | | | 438/199 |
| 2015/0108572 A1* | 4/2015 | Cheng | H01L 27/1211 |
| | | | 257/347 |

OTHER PUBLICATIONS

I. Ok et al., "Strained SiGe and Si FinFETs for high performance logic with SiGe/Si stack on SOI," 2010 IEEE International Electron Devices Meeting, EDM, 2010, 34.2, 4 pages.

K. Cheng et al., "High performance extremely thin SOI (ETSOI) hybrid CMOS with Si channel NFET and strained SiGe channel PFET," International Electron Devices Meeting (IEDM), 2012, 18.1, 4 pages.

K. Cheng et al., "FinFET CMOS with Si NFET and SiGe PFET," U.S. Appl. No. 14/969,833, filed Dec. 15, 2015.

\* cited by examiner

FINFET CMOS WITH SILICON FIN N-CHANNEL FET AND SILICON GERMANIUM FIN P-CHANNEL FET

BACKGROUND OF THE INVENTION

This disclosure relates to integrated circuit devices, and more specifically, to a method and structure to create advanced Si and SiGe FinFET structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

FinFET (Fin Field Effect Transistor) has become a preferred CMOS technology at 22 nm. The semiconductor industry has found an alternative approach to planar FETs with FinFETs to reduce leakage current in semiconductor devices. In a FinFET, an active region including the drain, the channel region and the source protrudes up in a "fin" from the surface of the semiconductor substrate upon which the FinFET is located. Due to the many superior attributes, especially in the areas of device performance, off-state leakage and footprint, FinFETs are replacing planar FETs. CMOS FinFET devices have both FinFETs which use n-channels (nFETs) and FinFETs which use p-channels (pFETs). In some devices, different channel materials are being developed for each type of transistor, i.e. nFET versus pFET, in advanced integrated circuits. For example, there is a class of FinFETs which use silicon channels for nFETs and silicon germanium channels for pFETs. However, due to the different materials used in the respective channels, it is difficult to provide isolation for both the n-channel FinFETs and p-channel FinFETs at small geometries.

Therefore, there is a need for improving CMOS FinFET fabrication technologies.

BRIEF SUMMARY

According to this disclosure, an advanced FinFET structure and a method for constructing the structure are described. A substrate having a silicon region and a silicon germanium region is provided. A first set of fins in the silicon region and a second set of fins in the silicon germanium region is etched into the substrate. A set of protective caps on upper portions of the first and second sets of fins. A lower portion of each of the first and second sets of fins is oxidized. The silicon germanium portion of the lower portion of fin in the second set of fins is completely oxidized. The lower portion of the first set of fins is partially oxidized. A punchthrough stop isolation region is formed in the lower portion of the first set of fins.

Another aspect of the invention is a device which is created by the method.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
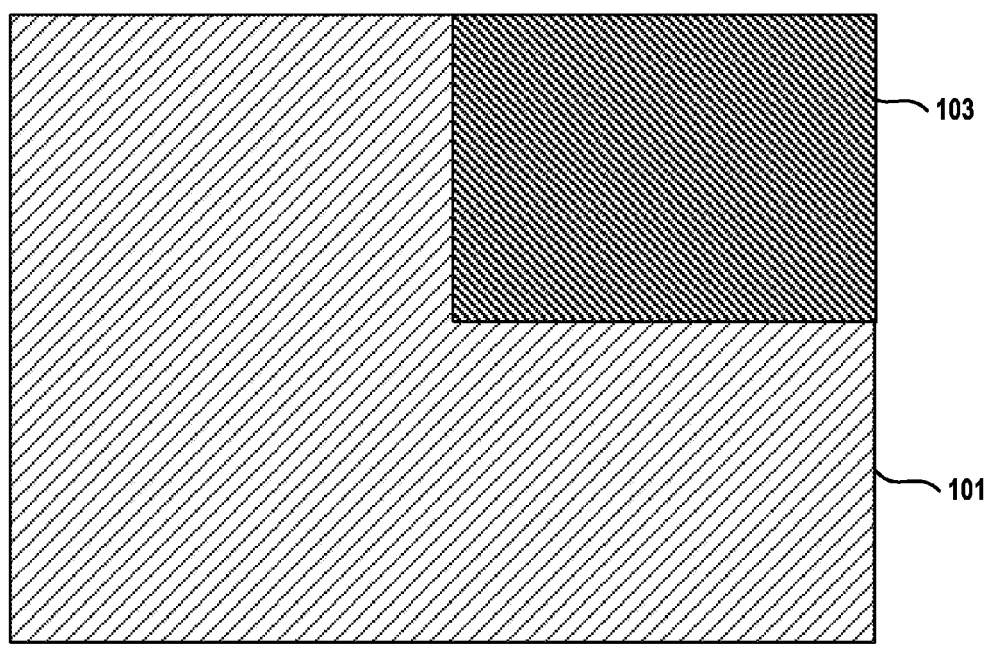
FIG. 1 is a cross-sectional diagram depicting the substrate structure after etching and SiGe epitaxy steps have been performed according to a first embodiment of the invention.

At a high level, the invention provides a method and resulting structure provides a method and structure for forming a FinFET, e.g., a CMOS FinFET, with hybrid channel materials. Embodiments of the invention use silicon fins for N-channel FinFETs and SiGe fins for P-channel FinFETs with different, under fin isolations for the silicon fins than those used for the SiGe fins. For pFET, a low-temperature oxidation is used to oxidize a portion of SiGe under the SiGe fin channel to form dielectrically isolated SiGe fin channels. For nFET, a doped dielectric, e.g., boron doped silicate glass (BSG), is used to form "punchthrough stop" (PTS) doping as the isolation. In preferred embodiments of the invention, the BSG is deposited in a "blanket" deposition in both nFET and pFET regions, so no high aspect ratio patterning is needed for the PTS isolation.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention. It should also be understood that material compounds will be described in terms of listed elements, e.g., SiGe. These compounds include different proportions of the elements within the compound, e.g., SiGe includes $Si_xGe_y$. In addition, other elements may be included in the compound and still function in accordance with the present principles. The compounds with additional elements will be referred to herein as "alloys".

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

While dielectrically isolated FinFET technology provides superior isolation and low device variability, dielectric isolation by oxidation, particularly for the Si fins, requires high temperature oxidation which is detrimental to the SiGe fins due to strain relaxation of the SiGe fins. PTS doping by doped oxide liners is an alternative isolation scheme. However, for CMOS, two different oxide liners, an n-type doped liner and a p-type doped liner, are respectively needed for pFET devices and nFET devices. Patterning dual oxide liners on high aspect ratio fins, particularly for highly scaled fin pitches, has become extremely challenging as the geometries of integrated circuits decrease.

Embodiments will be explained below with reference to the accompanying drawings.

FIG. 1 is a cross-sectional diagram depicting the substrate structure after etching and SiGe epitaxy steps have been performed according to a first embodiment of the invention. In preferred embodiments of the invention, the process patterns a bulk silicon substrate 101 and etches the portion of the substrate wherein the SiGe fins will be formed. However, other substrates including silicon layers can be used in alternative embodiments of the invention. Conventional patterning steps such as depositing a hardmask layer, then depositing a photoresist layer, lithographically patterning the photoresist, recessing (etching) the silicon in the pFET region, epitaxially growing the SiGe to fill the recess and stripping of the hardmask and photoresist layers are performed in embodiments of the invention to form the illustrated substrate. After the portion of the substrate in which the SiGe fins will be formed is defined, a layer of SiGe 103 is grown, for example, by selective SiGe epitaxy. As is known by those skilled in the art, the term "epitaxial" denotes that a material is formed using an epitaxial growth process.

Other methods of growing a SiGe layer are known to the art and can be used in embodiments of the invention. Conventionally, in an epitaxial growth and/or deposition process, the growth of a material on a surface of a semiconductor material, in which the material being grown has the same crystalline characteristics, e.g., crystalline plane orientation, as the semiconductor material. The Ge content in the SiGe region can range from 10% to 90% (atomic concentration) and preferably ranges from 20% to 50%. In embodiments of the invention, the SiGe layer 103 has a thickness from 20 nm to 150 nm with a thickness from 50 nm to 80 nm being preferred.

Figure 2:
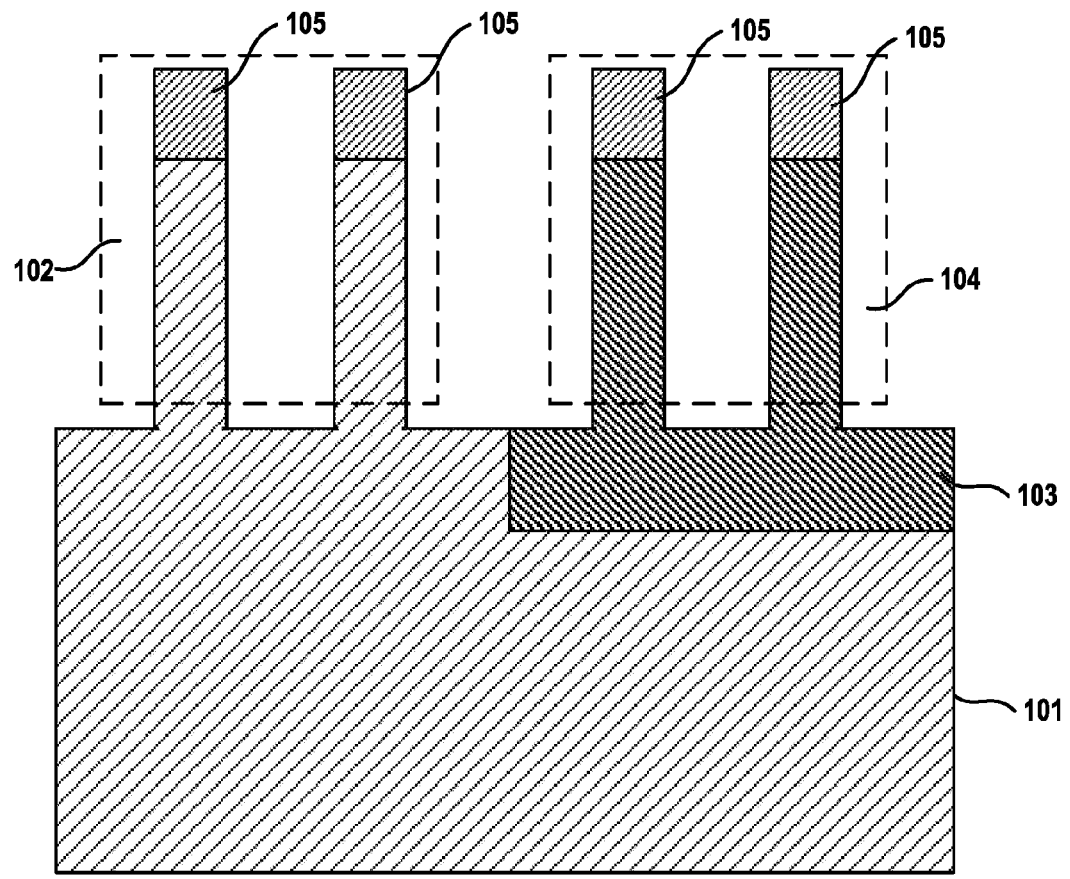
FIG. 2 is a cross-sectional diagram depicting the substrate structure after a patterning step has been performed forming Si and SiGe fins according to a first embodiment of the invention.

FIG. 2 is a cross-sectional diagram depicting the substrate structure after a patterning step has been performed forming Si fins and SiGe fins according to a first embodiment of the invention. In preferred embodiments of the invention, a hardmask layer 105 is deposited and patterned over the Si 101 and SiGe 103 regions of the substrate. In embodiments of the invention, the hardmask layer 105 is comprised of silicon nitride, with a typical thickness of 30-50 nm. The hardmask width ranges from 5 nm to 20 nm to achieve the correct thickness of the fins, with widths of 10-15 nm being preferred in some embodiments. The hardmask layer 105 is deposited, for example, by a low pressure chemical vapor deposition (LPCVD) process or any other suitable deposition technique. However, hardmask layer 105 can be comprised of any material in a range of thicknesses that can act as a hardmask during etching of the Si 101 and SiGe 103 regions.

The hardmask layer 105 is patterned so that a respective mask is formed where each of a first set of Si fins 102 are to be formed in the Si 101 region and a second set of SiGe fins 104 are to be formed in the SiGe 103 region using an etch process. Any suitable patterning technique can be used to form fins. For example, a sidewall image transfer process can be employed to pattern the hardmask 105. Alternatively, the fin pattern can be formed by direct lithography (e.g., extreme ultraviolet (EUV)) followed by reactive ion etch (RIE). The etch process used to etch the fins is a reactive ion etch (RIE) process using a chlorine or fluorine based chemistry in some embodiments of the invention. Note that in this step of the process, the etch forming the fins in the SiGe 103 region only partially etches through the SiGe layer 103. At this point in the process, the fin height is in the range of 20-100 nm, with fin heights in the range of 30-80 nm being more preferred.

Figure 3:
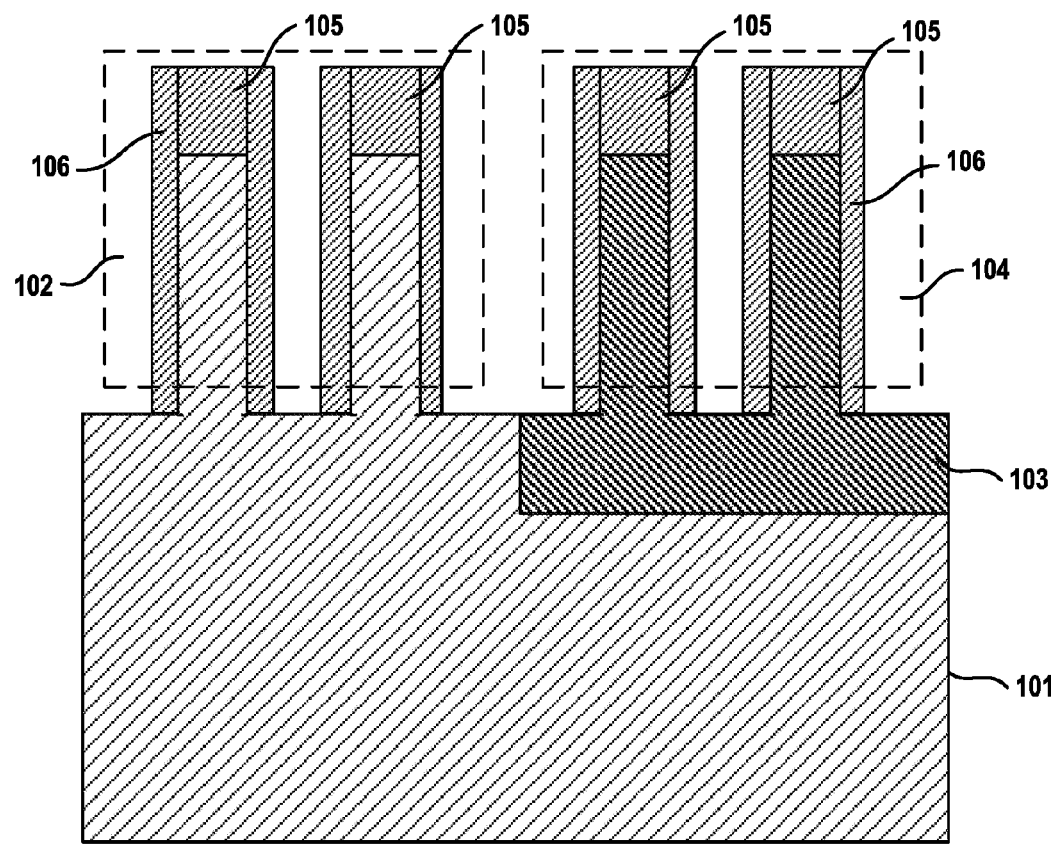
FIG. 3 is a cross-sectional diagram depicting the structure after a sidewall spacer step has been performed according to a first embodiment of the invention.

FIG. 3 is a cross-sectional diagram depicting the structure after a sidewall spacer step has been performed according to a first embodiment of the invention. In preferred embodiments of the invention, the sidewall material 106 is comprised of SiN, with a typical thickness of between 3-10 nm, and is conformally deposited, for example, by a LPCVD process. However, other materials are suitable as sidewall materials in other embodiments. The drawing illustrates a point in the process after an etch step where the sidewall material 106 originally deposited on top of the horizontal surface of the hardmask 105 and the horizontal surfaces of the Si layer 101 and the SiGe layer 103 has been removed. A pair of sidewalls is formed on each fin and the formation of the sidewalls completes the formation of a protective cap on an upper portion of the fins.

Figure 4:
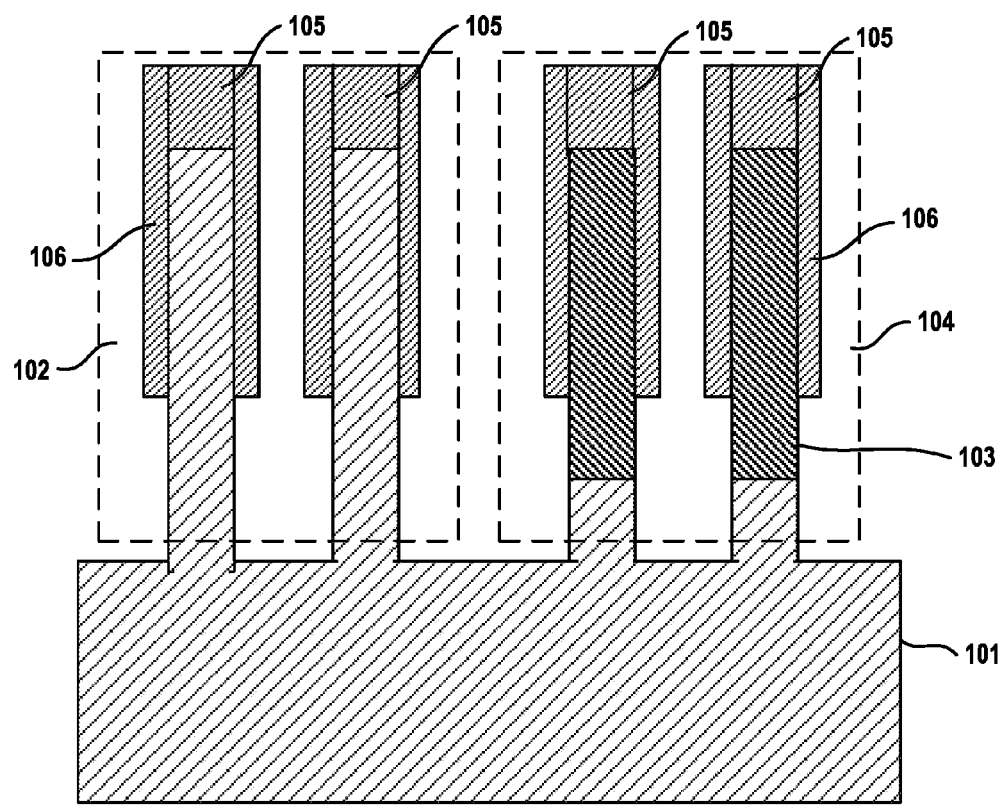
FIG. 4 is a cross-sectional diagram depicting the structure after an etch step has been performed lengthening the fins according to a first embodiment of the invention.

FIG. 4 is a cross-sectional diagram depicting the structure after an etch step has been performed, lengthening the fins according to a first embodiment of the invention. In this step, an etch process, such a chlorine based RIE process is used to lengthen the Si and SiGe fins. Note that a portion of the SiGe layer 103 is exposed underneath the cap. The cap is made of the hardmask 105 and sidewalls 106 on the Si fins 102 and the SiGe fins 104. In preferred embodiments of the invention, the same material, e.g., SiN, is selected for both the hardmask 105 and sidewalls 106. The fin etch process etches through the SiGe layer and through a portion of the silicon substrate 101 so that the SiGe fins 104 are each supported by a stub or pedestal of silicon 101. Likewise, the top portion of each Si fin 104 is protected by the respective caps in what will become the Si channel. The top portions of the Si fins are supported by the lower portions of the Si fins below the caps which are also referred to as silicon pedestals.

After the fin etch, the fins will be initially thicker below the cap because of the dimensions of the cap. In preferred embodiments of the invention, there is also a lateral etch of the fins 102, 104 below the cap to thin the pedestals, however, this is not a requirement of the invention. The thinning can be done by laterally etching the lower portions of the Si and SiGe fins, i.e. the portions not covered by the caps. Alternatively, the thinning can be done by oxidation, converting a portion of Si and SiGe into oxide and then stripping the oxide, e.g., by a wet process containing hydrofluoric acid. In preferred embodiments of the invention, the total fin height will be around 100 nm; alternative embodiments will range between 50-150 nm.

Figure 5:
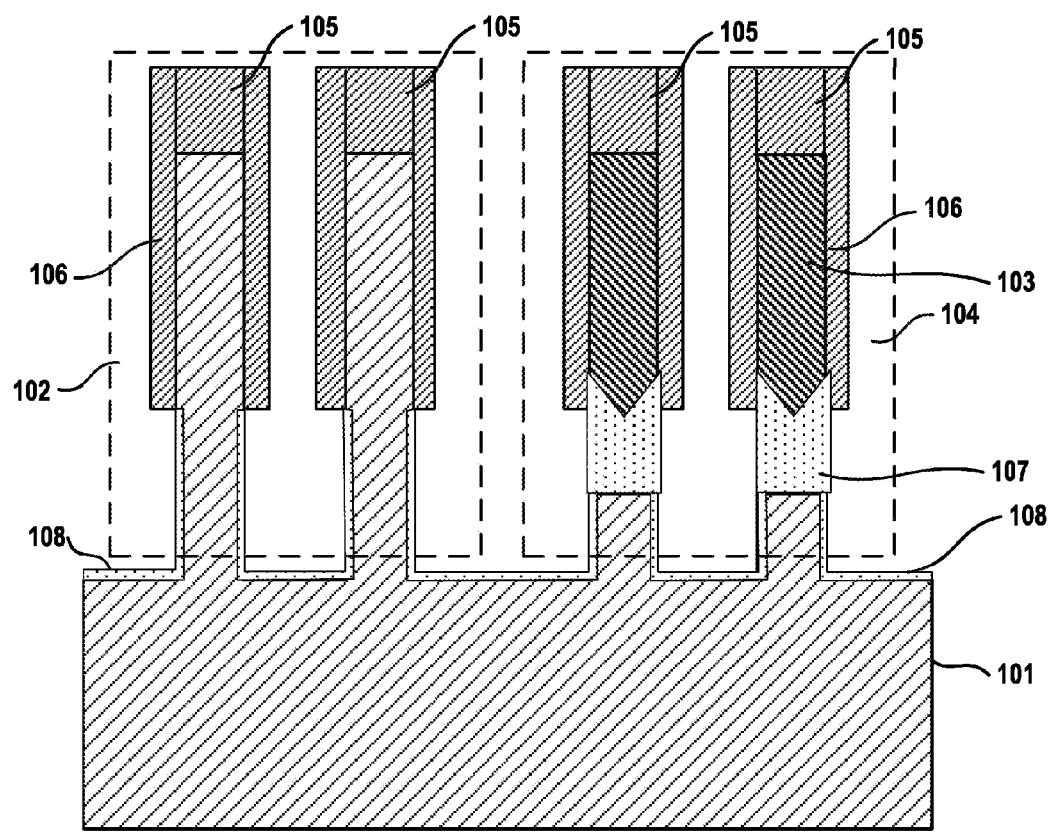
FIG. 5 is a cross-sectional diagram depicting the structure after a low temperature oxidation step has been performed according to a first embodiment of the invention.

FIG. 5 is a cross-sectional diagram depicting the structure after a low temperature oxidation step has been performed according to a first embodiment of the invention. In this step, the exposed SiGe at the bottom of the fins is completely oxidized, forming an oxide isolation 107. The silicon is only partially oxidized due to a slower oxidation rate of silicon versus silicon germanium. A thin layer of oxide 108 is shown in the drawing formed over the silicon portions of the structure. In a preferred embodiment, the low temperature oxidation is a low temperature wet oxidation carried out at a temperature of 650° C. for 60 minutes. In alternative embodiments, an oxidation process between 500° C. and 1000° C. for a period from 5 to 180 minutes is performed. A desired thickness for the oxide layer on the silicon fins ranges from 2 to 6 nm on the Si fin pedestal sidewalls. For SiGe fins, the entire SiGe pedestal is oxidized. The total lateral oxide thickness of the oxide isolation 107 below SiGe fins can range from 10 nm to 30 nm, depending on the SiGe fin pedestal thickness (lateral) before oxidation. A paper by M. Tanaka, et al., entitled "Comprehensive study of low temperature (<1000° C.) oxidation process in SiGe/SOI structures", in Thin Solid Films, p. 251, (2008) sets forth process conditions and oxidation rates in Si and SiGe for a variety of oxidation processes. For purposes of the invention, preferred process conditions are those in which the oxidation rate of SiGe is sufficiently greater than that of Si so that the complete oxidation region 107 can be formed under the SiGe fins 104 without oxidizing too much of the Si pedestals under the Si fins 102. Some portion of each of the Si fin pedestals needs to be kept un-oxidized after oxidation process for future steps.

Figure 6:
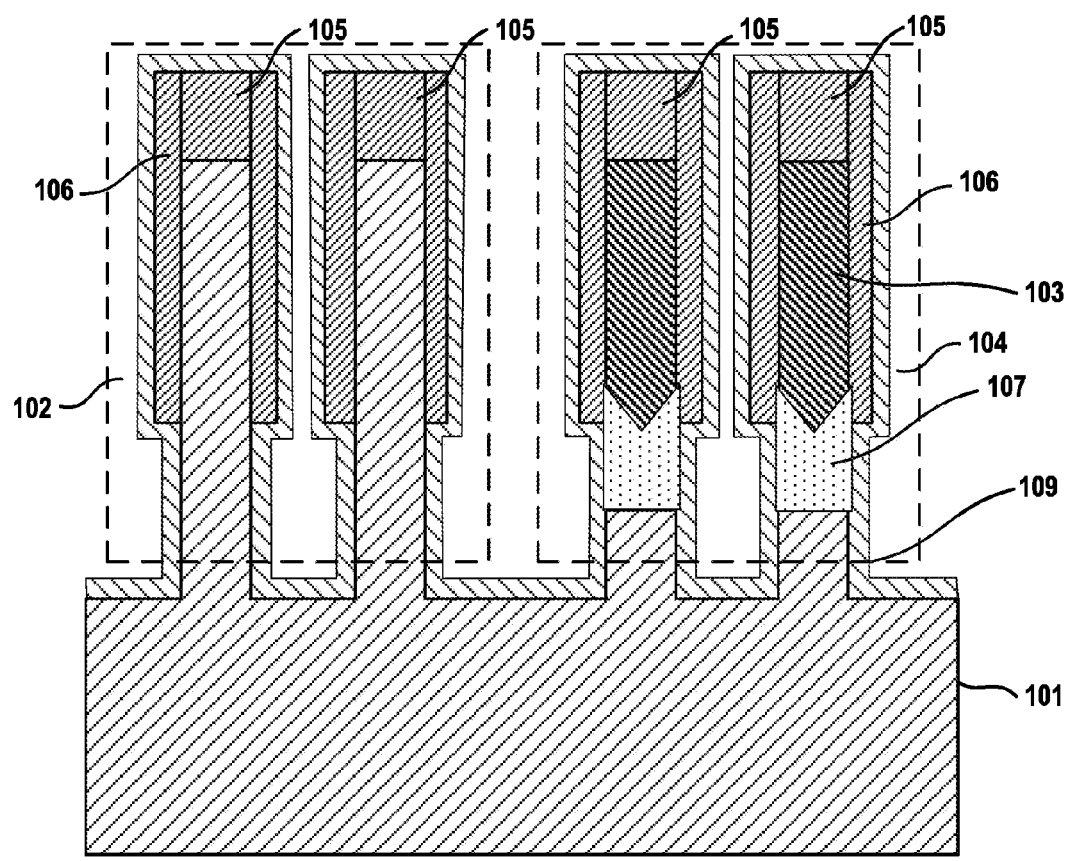
FIG. 6 is a cross-sectional diagram depicting the structure after an oxide removal step and boron-doped silicate glass (BSG) deposition step have been performed according to a first embodiment of the invention.

FIG. 6 is a cross-sectional diagram depicting the structure after an oxide removal step and boron-doped silicate glass (BSG) deposition step have been performed according to a first embodiment of the invention. In alternative embodiments of the invention, another boron-containing dielectric material can be used. For example, boron oxide deposited by atomic layer deposition (ALD) is used in alternative embodiments. Further, any p-type dopant can be used in the dielectric material, for example, boron, gallium and indium. The oxide removal step removes the thin oxide from the silicon regions, and in particular, from the Si fin pedestal sidewalls in preparation for the BSG deposition step (the thin layer labelled 108 in FIG. 5). Any suitable oxide removal process can be used. For example, a wet etch process containing hydrofluoric acid, or isotropic dry etch process such as chemical oxidation removal (COR).

Next, a BSG layer 109 is deposited on the entire structure, including over the oxide isolation 107 on the pFET side of the structure and directly contacting the pedestal portion fins 102 on the nFET side of the structure. In embodiments, the BSG layer 109 is deposited to a thickness of about 3 to 10 nm, although, other dimensions are contemplated by the present invention. Other processes for depositing the BSG layer include, but are not limited to, atomic layer deposition (ALD) and chemical vapor deposition (CVD).

In an alternative embodiment, it is possible to leave the thin oxide intact so long as there is enough thermal budget to drive the boron into the silicon pedestal. However, the inventors believe it is preferable to remove the thin oxide so the BSG layer 109 is directly formed on Si fin sidewalls.

Figure 7:
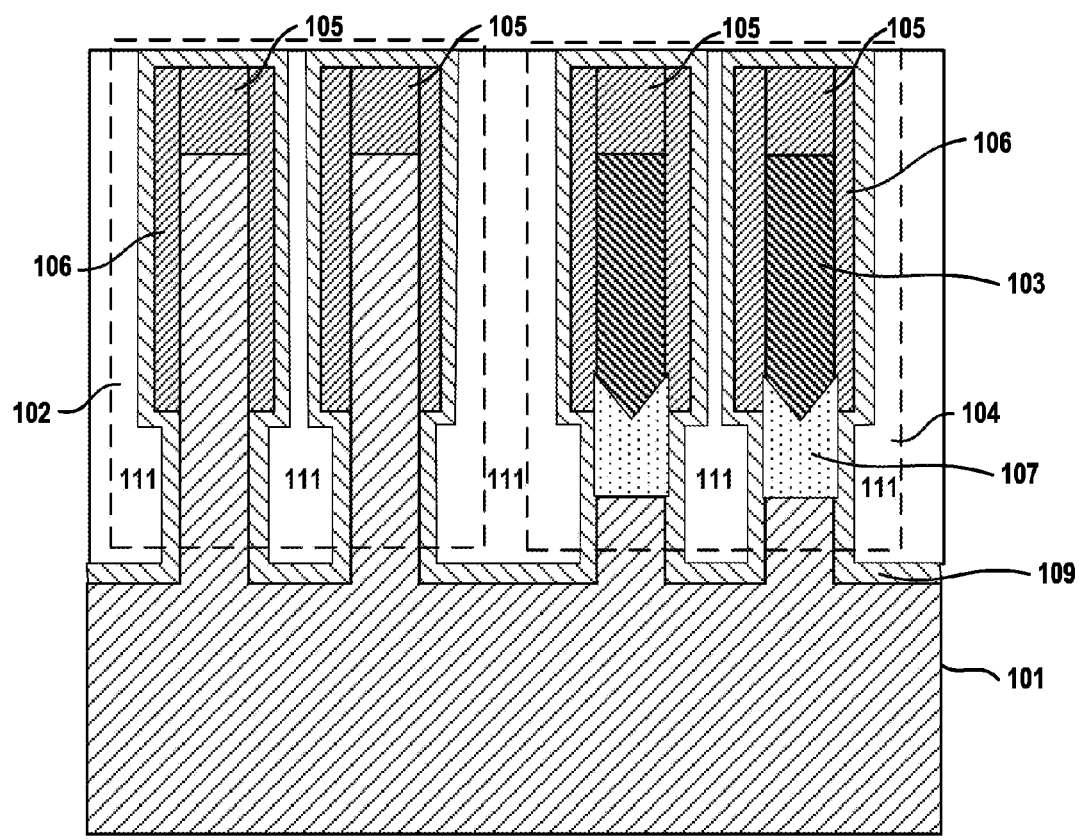
FIG. 7 is a cross-sectional diagram depicting the structure after a flowable oxide fill step, a thermal anneal step and a planarization step have been performed according to a first embodiment of the invention.

FIG. 7 is a cross-sectional diagram depicting the structure after an oxide fill step, a thermal anneal step and a planarization step have been performed according to a first embodiment of the invention. In some embodiments, flowable oxide 111 is deposited and flows into the trench areas between the fins to provide electrical insulation between the fins. The flowable oxide 111 can be for example, a polymer hydrogen silsesquioxane (HSQ) or a carbon doped silicon oxide. Alternatives to flowable oxide in other embodiments include, but are not limited to, spin-on-glass, and dielectrics created by CVD, HDP-CVD (high-density plasma CVD), PECVD (plasma-enhanced CVD) processes. In some embodiments, a combination of those processes is used to fill gaps. In some embodiments, a cyclic process of deposition/recess can be used to fill gaps. In preferred embodiments of the invention, a densification anneal is performed to enhance densification of the flowable oxide 111. In one embodiment, the densification anneal may be performed at a temperature ranging from about 400 degrees Celsius to about 800 degrees Celsius. In another embodiment, the densification anneal may be performed at a temperature ranging from about 900 degrees Celsius to about 1100 degrees Celsius.

The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the flowable oxide 111 so that it is coplanar with the top of the BSG layer 109. Other planarization processes are known to the art and are used in alternative embodiments of the invention.

Figure 8:
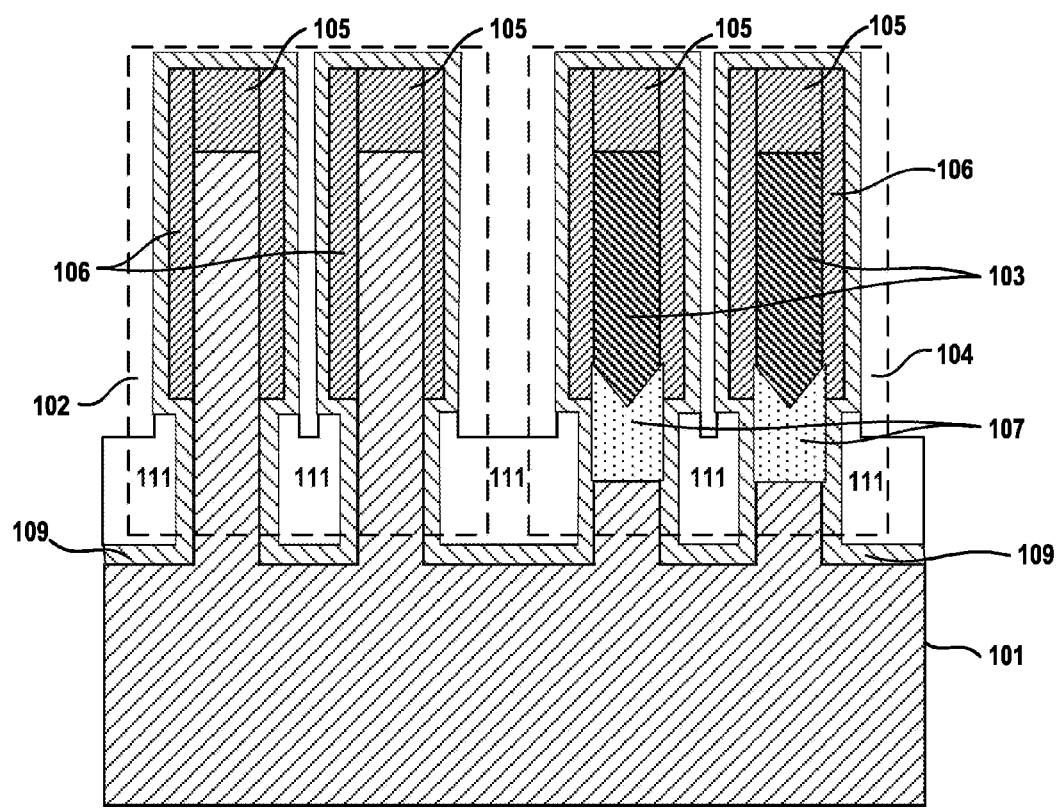
FIG. 8 is a cross-sectional diagram depicting the structure after an etch step has been performed according to a first embodiment of the invention.

FIG. 8 is a cross-sectional diagram depicting the structure after an etch step has been performed according to a first embodiment of the invention. The flowable oxide 111 is recessed to form shallow trench isolation (STI) disposed between and isolating respective FinFETs from each other. The STI recess process can be performed by wet etch, dry etch, or a combination of both. In preferred embodiments of the invention, a wet etch, e.g., using a hydrofluoric acid (HF) solution, is followed by a reactive ion etch step to perform the recess operation. As shown in the drawing, the recess step recesses the STI oxide 111 lower than the bottom of the sidewall 106 and the top of the oxide isolation 107 on the pFET side 104 of the structure, although the precise depth achieved by the recess is not a requirement of the invention.

Figure 9:
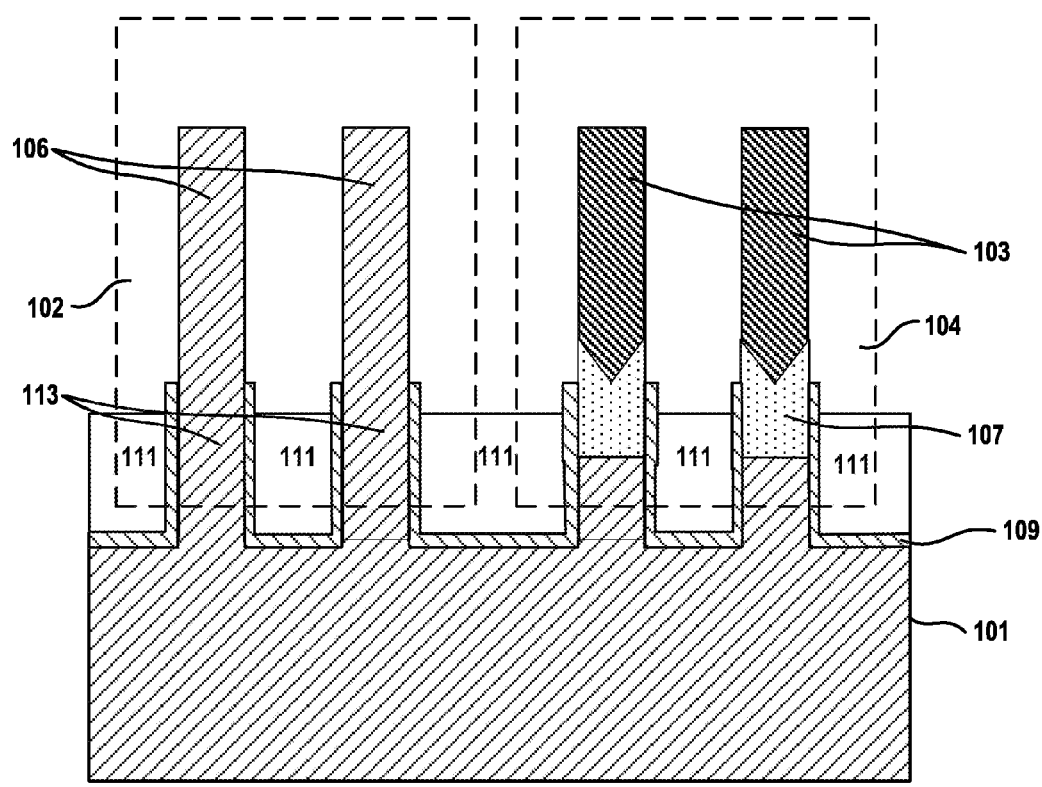
FIG. 9 is a cross-sectional diagram depicting the structure after a BSG removal step and spacer and hardmask removal step have been performed according to a first embodiment of the invention.

FIG. 9 is a cross-sectional diagram depicting the structure after a BSG removal step and spacer and hardmask removal step have been performed according to a first embodiment of the invention. The BSG layer is preferably selectively removed by contacting the BSG layer with an HF containing vapor. Alternatively, the BSG layer can be removed using a combination of hydrofluoric acid and sulfuric acid. Other means to remove BSG includes dry oxide etch. The hardmask removal will depend on the material used to create the hardmask and sidewalls. In one embodiment of the invention, the cap is formed of silicon nitride and the hardmask removal will include a nitride strip. Wet etchants which can be used to strip silicon nitride include phosphoric acid. Other means to remove silicon nitride includes a dry etch process such as plasma etch.

After the BSG and the caps have been removed, in the nFET region 102, the silicon fins are isolated by BSG punchthrough stop structures 113. In the pFET region 104, the silicon germanium fins are isolated by oxide isolation regions 107.

Boron in BSG layer is driven into the silicon pedestals below the Si fin channels to form PTS for nFET devices by a thermal annealing process, including but not limited to, rapid thermal annealing, laser annealing, flash annealing, furnace annealing, or any suitable combination of those techniques. During thermal annealing, boron diffuses from BSG layer into fins to form the PTS structures 113. The annealing can be done after STI oxide planarization, after STI recess, after removing STI recess and removal of the exposed BSG, or after nitride cap removal.

Figure 10:
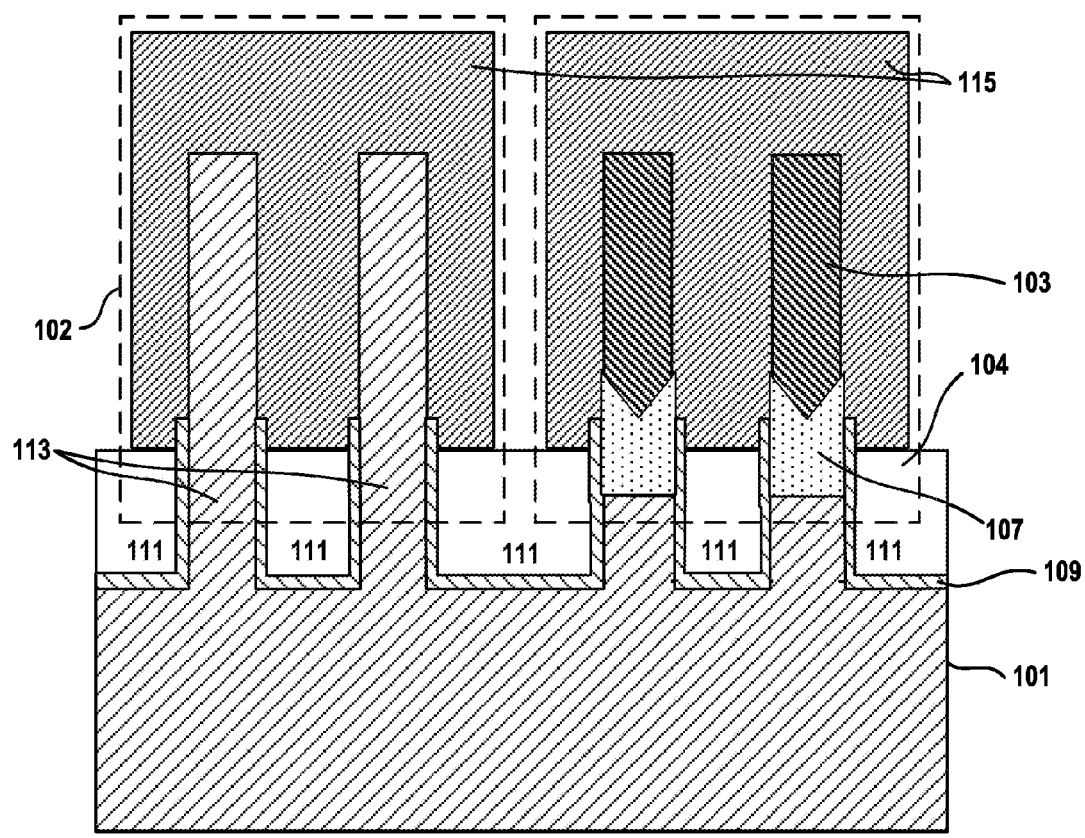
FIG. 10 is a cross-sectional diagram depicting the structure after a gate fabrication step has been performed according to a first embodiment of the invention.

FIG. 10 is a cross-sectional diagram depicting the structure after a gate fabrication step has been performed according to a first embodiment of the invention. The gate structure 115 is formed over the fins in the nFET 102 and pFET 104 regions. The source and drain are formed in the fins which because of the orientation of the cross-section through the gate structure 115 are not shown. The dopants from the BSG layer 109 are driven into the fin pedestals 113 below the fin channels 106 to form the PTS isolation for the nFET region 102. While the dopants from the BSG are also driven into the fin pedestals in the pFET region 104, the PTS isolation 114 in the supporting pedestals has little effect on the SiGe channels 103 as it is blocked by the oxide isolation regions 107.

Epitaxially grown regions (not shown) on the fins may be used to create source and drain regions on opposite sides of the gate structure 115. In preferred embodiments of the invention, the upper portions of the fins, i.e. the channel regions, are undoped for both Si and SiGe fins.

Processing of additional layers of the integrated circuit device proceeds after the steps illustrated in the disclosure. For example, contacts and wiring could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a FinFET device comprising:
   providing a substrate having a silicon nFET region and a silicon germanium pFET region;
   etching a first set of fins in the silicon region and a second set of fins in the silicon germanium region;
   forming a set of protective caps on upper portions of the first and second sets of fins;
   oxidizing a lower portion of each of the first and second sets of fins, wherein a silicon germanium portion of the lower portion of a fin in the second set of fins is completely oxidized and the lower portion of a fin in the first set of fins is partially oxidized;
   after oxidizing the lower portion of each of the first and second sets of fins, forming a doped dielectric layer containing a p-type dopant over the first and second set of fins; and
   annealing the first and second set of fins, driving the p-type dopant into a silicon containing portion of the first and second set of fins forming doped regions in the lower portion of the first and second set of fins, the doped region is a punchthrough stop isolation region in the lower portion of the first set of fins, the doped region in the lower portion of the second set of fins is separated from the upper portion by the completely oxidized portion.

2. The method as recited in claim 1, wherein the etching further comprises a first etch step which creates the upper portions of the first and second set of fins and second etch step which creates the lower portions of the first and second set of fins, and wherein a completion of the forming of the protective caps occurs between the first and the second etch steps.

3. The method as recited in claim 1, wherein the the doped dielectric comprises a boron-doped silicate glass layer.

4. The method as recited in claim 3, further comprising:
   depositing an insulator over the boron-doped silicate glass layer; and
   performing a planarization step to planarize the insulator.

5. The method as recited in claim 1, further comprising forming a set of gate structures over the first and second set of fins, and wherein the first set of fins are in an n-type device and the second set of fins are in a p-type device.

6. The method as recited in claim 2, further comprising:
   forming a hardmask pattern for the first etch, wherein a respective mask is formed over each fin of the first and second fins;
   following the first etch step forming a pair of sidewall structures on each fin of the first and second sets of fins; and
   wherein the caps include a respective mask and pair of sidewall structures.

7. The method as recited in claim 1, wherein the oxidizing is a low temperature oxidation in which the oxidation rate of silicon germanium is higher than the oxidation rate of silicon.

8. The method as recited in claim 2, wherein the second etch step etches through the silicon germanium region and into a silicon region disposed below the silicon germanium region.

9. The method as recited in claim 3, further comprising removing the boron-doped silicate glass only from the upper portions of the first and second set of fins.

10. The method as recited in claim 1, further comprising prior to forming the doped dielectric layer, performing an etch step to remove a thin oxide from the lower portions of the first fins.

11. The method as recited in claim 4, further comprising recessing the planarized insulator lower than a top of the oxide isolation in the second set of fins.

12. The method as recited in claim 1 wherein a height of upper portions of the first and second sets of fins is in the range of 30-80 nm and a total height of the first and second fins is in the range of 50-100 nm.

13. The method as recited in claim 1 further comprising a lateral etch of lower portions of the first and second sets of fins to thin a thickness of the lower portions of the first and second sets of fins to equal a thickness of the upper portions of the first and second sets of fins.

14. A method for fabricating a FinFET device comprising:
   etching a first set of fins in a silicon region of a substrate and a second set of fins in a silicon germanium region of a substrate;
   forming a set of protective caps on upper portions of the first and second sets of fins;
   oxidizing lower portions of the first and second sets of fins, wherein a silicon germanium portion of the lower portion of a fin in the second set of fins is completely oxidized and the lower portion of a fin in the first set of fins is partially oxidized; and
   annealing a doped dielectric layer containing a p-type dopant formed over the first and second set of fins, driving the p-type dopant into a silicon containing portion of the lower portions of the first and second set of fins, forming doped regions in the lower portions of the first and second set of fins, the doped region is a punchthrough stop isolation region in the first set of fins, the doped region in the second set of fins is separated from the upper portion of the fins by the completely oxidized portion.

15. The method as recited in claim 1, wherein the oxidizing of the lower portions of the first and second set of fins is accomplished in a single oxidation step.

16. The method as recited in claim 1, wherein the annealing and driving is accomplished in a single annealing step.

* * * * *